(12) United States Patent
George et al.

(10) Patent No.: US 6,713,177 B2
(45) Date of Patent: Mar. 30, 2004

(54) INSULATING AND FUNCTIONALIZING FINE METAL-CONTAINING PARTICLES WITH CONFORMAL ULTRA-THIN FILMS

(75) Inventors: Steven M. George, Boulder, CO (US); John D. Ferguson, Boulder, CO (US); Alan W. Weimer, Niwot, CO (US); Jeffrey R. Wank, Louisville, CO (US)

(73) Assignee: Regents of the University of Colorado, Boulder, CO (US)

( * ) Notice: Subject to any disclaimer, the term of this patent is extended or adjusted under 35 U.S.C. 154(b) by 0 days.

(21) Appl. No.: 10/196,934

(22) Filed: Jul. 16, 2002

(65) Prior Publication Data

US 2003/0026989 A1 Feb. 6, 2003

Related U.S. Application Data

(63) Continuation-in-part of application No. 09/602,602, filed on Jun. 21, 2000.
(60) Provisional application No. 60/306,519, filed on Jul. 18, 2001.

(51) Int. Cl.$^7$ ................................................. B32B 5/16
(52) U.S. Cl. ........................ 428/402; 428/403; 428/404; 427/126.1; 427/128; 427/212; 427/214; 427/215; 427/249.5; 427/249.1; 427/255; 427/255.3; 427/561
(58) Field of Search ................................ 428/402, 403, 428/404; 427/128, 215, 561, 255, 255.3, 126.1, 212, 214, 249.1, 249.5

(56) References Cited

U.S. PATENT DOCUMENTS

| | | | |
|---|---|---|---|
| 5,271,969 A | * | 12/1993 | Ogura |
| 5,273,942 A | * | 12/1993 | McCouley |
| 5,705,265 A | | 1/1998 | Clough et al. ........... 428/307.3 |
| 5,985,175 A | * | 11/1999 | Fan |

OTHER PUBLICATIONS

Rony, Diffusion Kinetics within Supported Liquid–phase Catalysts, Journal of Catalysis 14, 142–147 (1969).
Yin et al., Study of Supported Liquid Phase Catalysts for Hydroformylation of Olefins Contained in FCC Dry Gas, Beijing, China, vol. 2, 614–620 (1991).
Wu et al., Catalytic Hydrodechlorination of $CCL_4$ Over Silia–supported $PDCL_2$–containing Molten Salt Catalysts: The Promotional Effects of $COCL_2$ and $CUCL_2$, Journal of Catalysis 161, 164–177 (1996).
Hoffmeister et al., The Influence of the Pore Structure of the Support on the Properties of Supported Liquid–phase Catalysts, Chem. Engineering Science, vol. 45, No. 8, 2575–2580 (1990).
Kolodziej et al., A Study of the Internal Diffusion of Gases in Porous Catalysts in the Presence of a Liquid Phase, Chemical Engineering and Processing, 31, 255–261 (1992).
Jutka et al., Investigations on the Use of Supported Liquid–phase Catalysts in Fluidized Bed Reactors, Institute for Technology, vol. 88, No. 289, 122–129, 1996.
Jelles et al., Supported Liquid Phase Catalysts, Studies in Surface Science and Catalysis, vol. 116, 667–674 (1998).
Freeeman et al., Thermal Destruction of Hazardous Waste—A State of the Art View, Journal of Hazardous materials 14, 103–117 (1987).
Brusewitz et al., Problems in Use of Supported Liquid–phase Catalysts in Fluidized Bed Reactors, Chem. Eng. Technol. 15, 385–389 (1992).
Johanson et al., Elimination of Hazardous Wastes by the Molten Salt Destruction Process, Rockwell International, 234–242, 1989.
Stelman et al., Treatment of Mixed Wastes by the Molten Salt Oxidation Process, Rockwell International, 795–799, 1993.
Upadhye, Molten Salt Destruction of Energetic Material Wastes as an Alternative to Open Burning, Chemistry for the Protection of the Environment 2, 267–276 (1996).
Upadhye, Molten Salt Takes the Bang Out of High Explosives, http://www.llnl.gov/str/upadhye.html, 1–4 (2000).
Greenburg, Method of Catalytically Inducing Oxidation of Carbonaceous Materials by the Use of Molten Salts, U.S. patent 3647358 (1972).
Klaus et al., Atomic Layer Cantrolled Growth of $SIO_2$ Films Using Binary Reaction Sequence Chemistry, Appl. Phys. Lett. 70, 1092–1094 (1997).
Dillon et al., Surface Chemistry of $AL_2O_3$ Deposition Using $AL(CH_3)_3$ and $H_2O$ in a Binary Reaction Sequence, Surface Science 322, 230–242 (1995).
Sneh et al., Atomic Layer Growth of $SIO_2$ on IS(100) Using $SICL_4$ and $H_2O$ in a Binary Reaction Sequence, Surface Science 344, 135–152 (1995).

* cited by examiner

Primary Examiner—Leszek Kiliman
(74) Attorney, Agent, or Firm—Gary C Cohn PLLC

(57) ABSTRACT

Particles have an ultrathin, conformal coating are made using atomic layer deposition methods. The base particles include ceramic and metallic materials. The coatings can also be ceramic or metal materials that can be deposited in a binary reaction sequence. The coated particles are useful as fillers for electronic packaging applications, for making ceramic or cermet parts, as supported catalysts, as well as other applications.

83 Claims, No Drawings

INSULATING AND FUNCTIONALIZING FINE METAL-CONTAINING PARTICLES WITH CONFORMAL ULTRA-THIN FILMS

CROSS-REFERENCE TO RELATED APPLICATION

This application is a continuation-in-part of copending application Ser. No. 09/602,602, filed Jun. 21, 2000, now pending incorporated by reference in its entirety. This application also claims benefit of provisional application Ser. No. 60/306,519, filed Jul. 18, 2001.

BACKGROUND OF THE INVENTION

This invention relates to particles having ultrathin coatings on their surfaces and to methods for making and using such coated particles.

Ceramics and metals are used in particulate form in a variety of industrial settings, such as in the electronics and structural advanced materials industries. It is often desirable to alter the surface properties of these particles while maintaining their bulk properties.

For example, in some cases the particles have reactive surfaces that can be attacked by the surrounding environment or which otherwise engage in undesirable reactions. In these cases, it is often desirable to passivate the reactive surfaces to inhibit these reactions from occurring.

Conversely, it is desirable in other situations to activate the particle surfaces for various reasons, such as to improve coupling to other materials (or between particles) or to promote desired chemical reactions. In this manner, it would be desired to provide for improved coupling at ceramic/polymeric, ceramic/metallic (cermet), or ceramic/ceramic (monolithic or composite) particulate interfaces. For example, boron nitride (BN) and aluminum nitride (AlN) particles have been developed as fillers for electronics packaging applications. These materials significantly enhance the thermal conductivity of polymer-based composite packages, while maintaining good electrical insulation. These properties are becoming increasingly important as faster and denser integrated circuits are being developed by the microelectronics industry. The high thermal conductivity of BN and AlN make them attractive candidates for filler materials. However, the surfaces of BN and AlN particles are relatively nonreactive and do not adhere well to the coupling agents commonly used with these epoxy polymers. This incompatibility with the polymer makes it difficult to load these materials at levels sufficient for use with newer, high-density integrated circuits. Thus, it is desirable to find a way to improve the adhesion of these particles to the polymer matrix and to incorporate more of these nitride particles into the packaging material without significantly decreasing the thermal conductivity of the particles.

Another example of the desire to modify surface properties of materials comes from the ceramics industry. The development of sintering methods has enabled the widespread use of advanced ceramic materials for various applications. Densification of a ceramic material through sintering can be achieved by several methods that involve heating constituent particles either with pressure (such as hot-pressing, hot isostatic pressing, or gas pressure assisted sintering) or without pressure (such as pressureless sintering). Pressureless sintering is a preferred method due to its low cost. However, it requires the development of specialized processing formulations that usually involve liquid phase sintering. It is important to be able to control the surface properties of the constituent particles during pressureless sintering densification. In addition, it is desirable in these sintering applications to obtain a uniform dispersion of sintering aids, and to disperse the sintering aid as finely as possible.

While currently practiced commercial methods such as wet chemistry, physical vapor deposition (PVD), chemical vapor deposition (CVD), and plasma-enhanced CVD (PE-CVD) offer outstanding coating processing for flat substrates and large particles where relatively thick and non-uniform coatings are acceptable, they do not allow the controlled nanocoating of individual ultra-fine particles. In certain cases, the currently practiced processes are line-of-sight dependent (e.g. PE-CVD), do not provide for a chemically bonded film to the substrate surface (e.g. PVD), leave residue on the surface (e.g. wet methods), and/or cannot control the thickness of a non-granular film at the angstrom level (e.g. CVD).

Thus, it would be desirable to provide a method by which the surface properties of particulate materials can be modified without significantly changing the bulk properties of the particulate material.

SUMMARY OF THE INVENTION

In one aspect, this invention is a material in the form of particles having an average diameter of up to about 500 microns wherein the particles have an ultrathin, inorganic material deposited on the surface thereof.

In another aspect, this invention is a method for depositing an ultrathin inorganic material on particles, comprising conducting a sequence of two or more selflimiting reactions at the surface of said particles to form an ultrathin inorganic material bonded to the surface of said particles.

In a third aspect, this invention is a resin matrix filled with particles of an inorganic material, wherein the particles have an ultrathin inorganic material on their surfaces.

In a fourth aspect, this invention is a method of making a cermet part, comprising forming a shaped mass from a plurality of particles of a sinterable inorganic material that have an ultrathin conformal metal coating on their surfaces, and then exposing said shaped mass to conditions sufficient to sinter the particles to form a shaped part.

In a fifth aspect, this invention is a method of making a ceramic part, comprising forming a shaped mass from a plurality of particles of a sinterable inorganic material that have an ultrathin coating of a sintering aid on their surfaces, and then exposing said shaped mass to conditions sufficient to sinter the particles to form a shaped part.

In a sixth aspect, this invention is a method of catalyzing a chemical reaction, comprising conducting said chemical reaction in the presence of particles having an average diameter of less than 500 microns and having on their surfaces an ultrathin deposit of a metal which is a catalyst for said chemical reaction.

DETAILED DESCRIPTION OF THE INVENTION

In this invention, ultrathin coatings are provided onto the surfaces of various particulate materials. The size of the particles will depend somewhat on the particular material and the particular application. Suitable particle sizes range up to about 500 $\mu$m, with preferred particle sizes ranging from the nanometer range (e.g. about 0.001 $\mu$m) to about 100 $\mu$m, more preferred particle sizes ranging from 0.005 to about 50 $\mu$m, even more preferred particle sizes ranging from about 0.1 to 10 $\mu$m and most preferred particle sizes ranging from about 0.4 to about 10 μm. Particle size can also be expressed in terms of the surface area of the particles. Preferred particulate materials have surface areas in the range of about 0.1 to 200 m²/g or more.

A wide variety of particulate materials can be used as the substrate. The composition of the base particle and that of the inorganic material are typically selected together so that the surface characteristics of the particle are modified in a way that is desirable for a particular application. The base particles preferably have some functional group on the surface that can participate in a reaction sequence that creates the ultrathin inorganic deposit. Examples of such functional groups include hydroxyl groups, amino groups and metal-hydrogen bonds, which can serve as sites of further reaction to allow formation of the ultrathin deposits of inorganic material. If necessary, the surface of the particle can be treated to introduce such functional groups. Depending on the particular base particle, techniques such as water plasma treatment, ozone treatment, ammonia treatment and hydrogen treatment are among the useful methods of introducing functional groups.

Inorganic materials are of particular interest as the base particle. Substrate particles of interest include metal, metal alloy, metal salt, metal organic, metal oxide, metal hydroxide, metal nitride and mixed lattice particles. Suitable particles may comprise a metal matrix. Preferred particle compositions include Group IIa (such as Mg), Group IIIb (such as Sc), Group IVb (such as Ti), Group Vb (such as V and Nd), Group VIIIb (such as Mn), iron Group VIII (such as Fe, Co, and Ni), Group IIb (such as Zn and Hg), and Group IIIa (such as B and In) metal, metal alloy, metal salt, metal organic, metal oxide, metal hydroxide, metal nitride and mixed lattice particle compositions.

Several types of substrate particles that are of particular interest are those which (1) are sinterable with the use of a sintering aid to form a ceramic part, (2) are useful as high thermal conductivity fillers, such as for electronic packaging applications, (3) have reactive surfaces that are desirably passivated for certain applications, (4) are useful in making cermet (ceramic metallic) composite materials (5) are useful supports for other materials, such as catalyst supports, (6) are magnetic materials, (7) are absorbers of electromagnetic radiation, or (8) are metal fuels. It will be recognized that many materials are useful for more than one of these applications.

Examples of inorganic materials that can be sintered to form ceramic parts include, for example various nitrides, carbides, borides and other nonoxide ceramic materials.

Inorganic materials that are useful as high thermal conductivity fillers for electronics packaging applications preferably have bulk thermal conductivities of greater than about 3 W/mK, preferably greater than 5 W/mK, more preferably greater than 10 W/mK, even more preferably greater than about 15 W/mK and most preferably greater than about 200 W/mK. Suitable such materials include, for example, silicon dioxide, alumina, nitrides of Groups 3, 13 and 14 elements and carbides of Group 4, 6, 13 and 14 elements. Preferred nitrides for filler applications include aluminum nitride (AlN), boron nitride (BN) (especially hexagonal BN) and silicon nitride ($Si_3N_4$). A preferred carbide is tungsten carbide (WC).

Examples of inorganic materials having reactive surfaces that are desirably passivated for certain applications include, for example, inorganic oxides such as alumina, titania, silica and zirconia as well as titanium carbide, boron carbide, silicon nitride and aluminum nitride. Among these, of particular interest are the so-called "nanosized" particles having particle diameters of less than about 10 nanometers. Many of these extremely small particles tend to be extremely sensitive to oxidation.

Inorganic materials useful in cermet applications include nonoxide inorganic materials such as, for example, silicon nitride, aluminum nitride, boron nitride, tungsten carbide, boron carbide and titanium carbide.

Inorganic materials that are useful support materials include alumina, silica, zirconia and various natural and synthetic zeolite materials.

In addition, particulate metals are of interest, particularly particulate metals of the iron group, such as iron, cobalt and nickel, as well as various alloys. Magnetic or paramagnetic particles such as Fe, Co, Ni, Zn, Mn, Mg, Ca, Ba, Sr, Cd, Hg, Al, B, Sc, Ga, V, Ti, In, $Fe_3O_4$, $Fe_2O_3$, $TiO_2$, ZnO, FeO or a mixture of any two or more of the foregoing are useful in electromagnetic applications, medical imaging applications and certain drug delivery applications, as described more below. Metal particles, especially iron particles, are useful absorbers or electromagnetic radiation. Magnetic or paramagnetic materials such as iron, nickel and or neodymium-iron-boron (Nd—Fe—B) permanent magnetic materials.

The inorganic deposits formed in the ALD process may take the form of individual particles or a continuous or semi-continuous film. The physical form of the deposits will depend on factors such as the physical form of the substrate and the number of times the reaction sequence is repeated.

The deposits of inorganic material are "ultrathin". By "ultrathin", it is meant that the thickness of the deposit is up to about 100 nm, more preferably from about 0.1 to about 50 nm, even more preferably from about 0.5–35 nm and most preferably from about 1 and about 20 nm.

The particulate is preferably non-agglomerated after the inorganic material is deposited. By "non-agglomerated", it means that the particles do not form significant amounts of agglomerates during the process of coating the substrate particles with the inorganic material. Particles are considered to be non-agglomerated if (a) the average particle size does not increase more than about 5%, preferably not more than about 2%, more preferably not more than about 1% (apart from particle size increases attributable to the coating itself) as a result of depositing the coating, or (b) if no more than 2 weight %, preferably no more than 1 weight % of the particles become agglomerated during the process of depositing the inorganic material.

The ability to deposit the inorganic material without forming agglomerates is very significant and surprising. Gas transport mechanisms allow the reactants to diffuse to the surfaces of individual particles that are in contact so that individual particle surfaces can be coated, even if those particle surfaces are in contact with surfaces of other particles. Frequently, van der Waals and/or electrostatic forces tend to cause individual particles being treated to cling together in loose agglomerates (which are not adhered together and can be easily separated). The formation of these loose agglomerates can even be beneficial in the coating process, particularly when a fluidized bed method is used, because the loose agglomerates often can be easily fluidized more easily than the individual particles. However, despite the formation of these loose agglomerates, all surfaces of the particles coated, i.e., it is the particles rather than the agglomerates that are coated. Further, as there is no physical mechanism for depositing the inorganic material (it all being deposited at a molecular scale), the deposits are formed without causing the primary particles to become adhered together. Even if the particles still tend to form loose aggregates, the individual particles are still easily separated as is true of the untreated substrate particles.

In preferred embodiments, the deposits of inorganic material form a conformal coating. By "conformal" it is meant that the thickness of the coating is relatively uniform across the surface of the particle (so that, for example, the thickest regions of the coating are no greater than 3X the thickness of the thinnest regions), so that the surface shape of the coated substrate closely resembles that of the underlying substrate surface. Conformality is determined by methods such as transmission electron spectroscopy (TEM) that have resolution of 10 nm or below. Lower resolution techniques cannot distinguish conformal from non-conformal coatings at this scale. The desired substrate surface is preferably coated substantially without pinholes or defects.

As is true of the underlying particle, the composition of the deposited inorganic material can vary considerably depending on the composition of the underlying particle and the intended end-use of the particle. Inorganic materials that can be applied via atomic layer controlled growth techniques, as described more below are preferred. Among inorganic materials that are readily applied in such a manner are binary materials, i.e., materials of the form $Q_xR_y$, where Q and R represent different atoms and x and y are numbers that reflect an electrostatically neutral material. Among the suitable binary materials are various inorganic oxides (such as silicon dioxide and metal oxides such as zirconia, alumina, silica, boron oxide, yttria, zinc oxide, magnesium oxide, $TiO_2$ and the like), inorganic nitrides such as silicon nitride, AlN and BN, inorganic sulfides such as gallium sulfide, tungsten sulfide and molybdenum sulfide, as well as inorganic phosphides. In addition, various metal coatings are useful, including cobalt, palladium, platinum, zinc, rhenium, molybdenum, antimony, selenium, thallium, chromium, platinum, ruthenium, iridium, germanium and tungsten.

The inorganic material may perform a variety of functions, depending on the nature of the base particle and the intended application. Thus, one function of the inorganic material may be to modify the surface properties of the base particle. For example, when the base particle is a filler material, the deposited inorganic material may be a material that improves the compatibility of the particle with the continuous phase material (for example, a thermoplastic or thermoset resin). This can permit, for example, higher filler loadings without significant change of the bulk properties of the base particle. Specific examples of this include AlN, BN or $Si_3N_4$ particles that are coated with silica or alumina in order to make them more compatible in an epoxy resin matrix for electronics packaging applications. Another possible function of the coating involves the case where a base particle has a surface that behaves in some undesirable way in a particular environment. In these cases, deposits of an inorganic material that is relatively nonreactive in that environment or which masks the undesirable behavior is useful. Thus, for example, metal particles can be coated with a layer of an electrical insulator layer. Another example is a protective coating that isolates the base particle from its environment. Thus, metal particles can be protected from oxidation by applying a coating of an inorganic material that isolates the metal from environmental oxidants. Similarly, particles that are hydrolytically unstable can be coated with a layer of a hydrolytically stable inorganic material, and so forth.

Alternately, the deposited inorganic material may itself be a reagent or catalyst in some chemical reaction. In these cases, this invention provides a convenient method of providing a high surface area reactive or catalytic material, and/or provides a way for finely dispersing the inorganic material. For example, a particle of a sinterable material can have a material such as an oxide glass (such as yttria and alumina) that functions as a sintering aid deposited on its surface. This invention thus provides a way to obtain an extremely fine and uniform dispersion of a sintering aid when making ceramic or cermet parts. Similarly, particles of a sinterable material can have metal deposits on their surfaces. When the particles are shaped and sintered, the metal becomes finely and uniformly dispersed within the part. Thus, particles of this type are particularly well adapted for cermet manufacture. In addition, the inorganic material can be a metal that functions as a reagent or catalyst in one or more chemical reactions. The metal is deposited onto any suitable support to provide a high surface area catalyst.

Illustrative combinations of substrate particulate materials and deposited inorganic coatings are:

1. Group 3, 13 or 14 nitride particles, such as AlN, BN and $Si_3N_4$ particles, coated with silica or alumina. These are useful for fillers for thermoplastic and thermoset resins, particularly epoxy resins such as are used in electronics packaging applications.
2. Group 3, 13 or 14 nitride particles, such as AlN, BN and $Si_3N_4$ particles, or Group 4, 6 or 13 or 14 carbide particles, especially tungsten carbide, boron carbide and titanium carbide particles, coated with an oxide glass or a metal. A suitable oxide glass is preferably yttrium oxide, alumina or a mixture of these. The metal is any that can function as a sintering aid or as the metal phase in a cermet part, such as cobalt, tungsten or nickel aluminide. Examples of specific combinations are aluminum nitride, boron nitride, silicon nitride or tungsten carbide coated with yttrium oxide, tungsten carbide coated with cobalt, boron carbide coated with aluminum metal and titanium carbide coated with nickel aluminide. These particles are useful in making ceramic or cermet parts. The particles can be very small particles (i.e., having surface area of 100 $m^2$/g or more) such as can be made in vapor phase processes. These particles can be coated according to the invention before being exposed to air.
3. Alumina, silica, titania or zeolite particles that are coated with a passivating coating. Coatings of particular interest are nitrides, especially Group 3, 13 or 14 nitrides, preferably AlN, BN or $Si_3N_4$. These particles can be used as fillers in applications where alumina, silica or zeolite would otherwise react in an undesirable way, as the passivating coating isolates the base particle from the environment. In the case of titania, the coated particles can exhibit reduced photocatalyic properties, which can be useful in certain coating applications.
4. Metal particles coated with an oxide coating, such as alumina, silica or yttrium oxide, with a nitride coating such as AlN, BN or $Si_3N_4$, or a sulfide coating such as gallium sulfide. Metals that oxidize easily are of particular interest, as these coatings can insulate the metal particles from oxidative environments. These coated metal particles can be used as fillers in a variety of applications. An example of particular interest is iron particles coated with silica or other material that is transparent to IR radiation. In addition, metals useful as the metal phase in cermet applications which are coated with a sintering aid are of particular interest.
5. Particles of an inorganic oxide, inorganic nitride or zeolite material that are coated with a catalytically active metal such as palladium, platinum, cobalt, zinc, magnesium, tungsten and the like.

6. Nanosized particles of metal or ceramic materials which are easily oxidized upon exposure to air, which are coated with a layer that protects the particle from oxidation. Specific examples are particles of iron and non-oxide ceramic materials such as titanium carbide, boron carbide, silicon carbide, tungsten carbide, aluminum nitride, boron nitride or silicon nitride, which are coated with, e.g., silica or alumina.

A suitable and preferred method for depositing the inorganic material is through atomic layer controlled growth techniques. Atomic layer controlled growth techniques permit the formation of deposits of up to about 0.3 nm in thickness per reaction cycle, and thus provide a means of extremely fine control over deposit thickness. In these techniques, the deposits are formed in a series of two or more self-limited reactions, which in most instances can be repeated to sequentially deposit additional layers of the deposited material until a desired thickness is achieved. In most instances, the first of these reactions will involve some functional group on the surface of the particle, such as an M—H, M—O—H or M—N—H group, where M represents an atom of a metal or semi-metal. The individual reactions are advantageously carried out separately and under conditions such that all excess reagents and reaction products are removed before conducting the succeeding reaction. It is preferred to treat the particles before initiating the reaction sequence to remove volatile materials that may be absorbed onto the surface. This is readily done by exposing the particles to elevated temperatures and/or vacuum. Also, in some instances a precursor reaction may be done to introduce desirable functional groups onto the surface of the particle, as described before.

Oxide deposits can be prepared on particles having surface hydroxyl or amine (MN—H) groups using a binary (AB) reaction sequence as follows. The asterisk (*) indicates the atom that resides at the surface of the particle or coating, and Z represents oxygen or nitrogen. $M^1$ is an atom of a metal (or semimetal such as silicon), particularly one having a valence of 3 or 4, and X is a displaceable nucleophilic group. The reactions shown below are not balanced, and are only intended to show the reactions at the surface of the particles (i.e., not inter-or intralayer reactions).

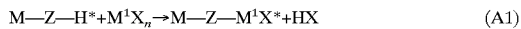  (A1)

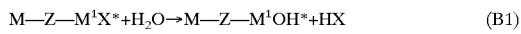  (B1)

In reaction A1, reagent $M^1X_n$ reacts with one or more M*—Z—H groups on the surface of the particle to create a new surface group having the form —$M^1$—X. $M^1$ is bonded to the particle through one or more Z atoms. The —$M^1$—X group represents a site that can react with water in reaction B1 to regenerate one or more hydroxyl groups. The hydroxyl groups formed in reaction B1 can serve as functional groups through which reactions A1 and B1 can be repeated, each time adding a new layer of $M^1$ atoms. Note that in some cases (such as, e.g., when $M^1$ is silicon, zirconium, titanium, boron, yttrium or aluminum) hydroxyl groups can be eliminated as water, forming $M^1$—O—$M^1$ bonds within or between layers. This condensation reaction can be promoted if desired by, for example, annealing at elevated temperatures and/or reduced pressures.

Binary reactions of the general type described by equations A1 and B1, where $M^1$ is silicon, are described more fully in J. W. Klaus et al., "Atomic Layer Controlled Growth of SiO$_2$ Films Using Binary Reaction Sequence Chemistry", *Appl. Phys. Lett.* 70, 1092 (1997) and O. Sheh et al., "Atomic Layer Growth of SiO$_2$ on Si(100) and H$_2$O using a Binary Reaction Sequence", *Surface Science* 334, 135 (1995), both incorporated herein by reference. Binary reactions of the general type described by equations A1 and B1, where $M^1$ is aluminum, are described in A. C. Dillon et al., "Surface Chemistry of Al$_2$O$_3$ Deposition using Al(CH$_3$)$_3$ and H$_2$O in a Binary reaction Sequence", *Surface Science* 322, 230 (1995) and A. W. Ott et al., "Al$_2$O$_3$ Thin Film Growth on Si(100) Using Binary Reaction Sequence Chemistry", *Thin Solid Films* 292, 135 (1997). Both of these references are incorporated herein by reference. General conditions for these reactions as described therein can be adapted to construct SiO$_2$ and Al$_2$O$_3$ coatings on particulate materials in accordance with this invention. Analogous reactions for the deposition of other metal oxides such as ZrO$_2$, TiO$_2$ and B$_2$O$_3$ are described in Tsapatsis et al. (1991) *Ind. Eng. Chem. Res.* 30:2152–2159 and Lin et al., (1992), *AIChE Journal* 38:445–454, both incorporated herein by reference.

A specific reaction sequence of the A1/B1 type that produces alumina is:

  (A1A)

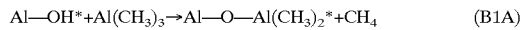  (B1A)

This particular sequence of reactions is particularly preferred to deposit alumina, as the reactions proceed well at temperature below 350 K. This particular reaction sequence tends to deposit Al$_2$O$_3$ ALD at a rate of ~1.2 Å per AB. Triethyl aluminum (TEA) can be used in place of trimethyl aluminum.

Analogous reaction sequences can be performed to produce nitride and sulfide deposits. An illustrative reaction sequence for producing a nitride coating is:

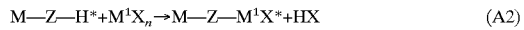  (A2)

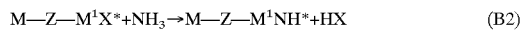  (B2)

Ammonia can be eliminated to form $M^1$—N—$M^1$ bonds within or between layers. This reaction can be promoted if desired by, for example, annealing at elevated temperatures and/or reduced pressures.

An illustrative reaction sequence for producing sulfide deposits is:

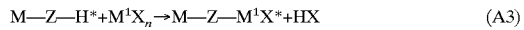  (A3)

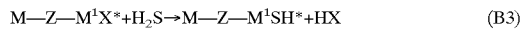  (B3)

Hydrogen sulfide can be eliminated to form $M^1$—S–$M^1$ bonds within or between layers. As before, this reaction can be promoted by annealing at elevated temperatures and/or reduced pressures.

A suitable binary reaction scheme for depositing inorganic phosphide deposits is described in Ishii et al, *Crystal. Growth* 180 (1997) 15, incorporated herein by reference.

In the foregoing reaction sequences, preferred metals $M^1$ include silicon, aluminum, yttrium, boron, titanium, zinc, magnesium and zirconium. Suitable replaceable nucleophilic groups will vary somewhat with $M^1$, but include, for example, fluoride, chloride, bromide, alkoxy, alkyl, acetylacetonate, and the like. Specific compounds having the structure $M^1X_n$ that are of particular interest are silicon tetrachloride, tungsten hexafluoride, tetramethylorthosilicate (Si(OCH$_3$)$_4$), tetraethylorthosilicate (Si(OC$_2$H$_5$)$_4$), trimethyl aluminum (Al(CH$_3$)$_3$), triethyl aluminum (Al(C$_2$H$_5$)$_3$), other trialkyl aluminum compounds, yttrium acetylacetonate, cobalt acetylacetonate, and the like.

In addition, catalyzed binary reaction techniques such as described in copending application 08/942,522 entitled "Method of Growing Films on Substrates at Room Temperatures Using Catalyzed Binary Reaction Sequence Chemistry", incorporated by reference, are suitable for depositing inorganic materials, especially oxide, nitride or sulfide coatings, most preferably oxide coatings. Reactions of this type can be represented as follows:

$$M—F_1+C_1 \rightarrow M—F_1\cdots C_1 \quad (A4a)$$

$$M—F_1\cdots C_1+F_2—M^1—F_2 \rightarrow M—M^1—F_2+F_1—F_2+C_1 \quad (A4b)$$

$$M—M^1—F_2+C_2 \rightarrow M—M^1—F_1\cdots C_2 \quad (B4a)$$

$$M—M^1—F_1\cdots C_2+F_1—M—F_1 \rightarrow M—M^1—M—F_1+F_1—F_2+C_2 \quad (B4b)$$

$C_1$ and $C_2$ represent catalysts for the A4b and B4b reactions, and may be the same or different. $F_1$ and $F_2$ represent functional groups, and M and $M^1$ are as defined before, and can be the same or different. Reactions A4a and A4b together constitute the first part of a binary reaction sequence, and reactions B4a and B4b together constitute the second half of the binary reaction sequence. An example of such a catalyzed binary reaction sequence is:

$$Si—OH^*(particle)+C_5H_5N \rightarrow Si—OH\cdots C_5H_5N^*$$

$$Si—OH\cdots C_5H_5N^*+SiCl_4 \rightarrow Si—O—SiCl_3^*+C_5H_5N+HCl$$

$$Si—O—SiCl_3^*+C_5H_5N \rightarrow Si—O—SiCl_3\cdots C_5H_5N^*$$

$$Si—O—SiCl_3\cdots C_5H_5N^*+H_2O \rightarrow Si—O—SiOH^*+C_5H_5N+HCl$$

where the asterisks (*) again denote atoms at the surface of the particle. This general method is applicable to depositing various other materials, including zirconia or titania.

Suitable binary reaction schemes for depositing metals include those described in the copending application filed Mar. 10, 2000 entitled "A Solid Material Comprising a Thin Metal Film on its Surface and Methods for Producing the Same", which is incorporated herein by reference. A specific reaction scheme described therein involves sequential reactions of a substrate surface with a metal halide followed by a metal halide reducing agent. The metal of the metal halide is preferably a transition metal or a semimetallic element, including tungsten, rhenium, molybdenum, antimony, selenium, thallium, chromium, platinum, ruthenium, iridium, and germanium. The halide is preferably fluoride. The reducing agent is a silylating agent such as silane, disilane, trisilane and mixtures thereof. For depositing tungsten, the sequence of reactions can be represented as:

$$M—OH^*(particle)+Si_2H_6 \rightarrow M—Si^*_2H_5 \quad (precursor\ reaction)$$

$$M—Si^*_2H_5+WF_6 \rightarrow M—W—F^*+Si_2H_6 \quad (A5)$$

$$M—W—F^*+Si_2H_yF_z \rightarrow M—W—Si^*_2H_5+H_2+SiH_aF_b \quad (B5)$$

Here, y, z, a and b represent positive integers that reflect an electrostatically neutral compound.

Another binary reaction scheme suitable for depositing a metal ($M^2$) on a particle having surface hydroxyl or amine groups can be represented as:

$$M^*—Z—H+M^2X_n \rightarrow M—Z—M^{2*}X+HX \quad (precursor\ reaction)$$

$$M—Z—M^2X^*+H_2 \rightarrow M—Z—M^2—H^*+HX \quad (B6)$$

$$M—Z—M^2—H^*_+M^2(acac) \rightarrow M—Z—M^2—M^{2*}(acac) \quad (A6)$$

"Acac" refers to acetylacetonate ion, and X, Z and M are as defined before. Also as before, the asterisk (*) refers to an atom residing at the surface of the particle. By heating to a sufficient temperature, hydrogen bonded to the surface as $M^2$—H will thermally desorb from the surface as $H_2$, thereby generating a final surface composed of $M^2$ atoms. Cobalt, iron and nickel are preferred metals for coating according to reaction sequence A6/B6.

Except for the catalyzed reaction scheme described above, the binary reactions are generally performed at elevated temperatures, preferably from about 300–1000 K. Between reactions, the particles are subjected to conditions sufficient to remove reaction products and unreacted reagents. This can be done, for example, by subjecting the particles to a high vacuum, such as about $10^{-5}$ Torr or less, after each reaction step. Another method of accomplishing this, which is more readily applicable for industrial application, is to sweep the particles with an inert purge gas between the reaction steps. This purge gas can also act as a fluidizing medium for the particles and as a carrier for the reagents.

Several techniques are useful for monitoring the progress of the reaction. For example, vibrational spectroscopic studies can be performed on high surface area silica powders using transmission Fourier transform infrared techniques. The deposited inorganic materials can be examined using in situ spectroscopic ellipsometry. Atomic force microscopy studies can be used to characterize the roughness of the coating relative to that of the surface of the substrate. X-ray photoelectron spectroscopy and x-ray diffraction can by used to do depth-profiling and ascertain the crystallographic structure of the coating.

A convenient method for applying the ultrathin deposits of inorganic material to the base particles is to form a fluidized bed of the particles, and then pass the various reagents in turn through the fluidized bed under reaction conditions. Methods of fluidizing particulate materials are well known, and generally include supporting the particles on a porous plate or screen. A fluidizing gas is passed upwardly through the plate or screen, lifting the particles somewhat and expanding the volume of the bed. With appropriate expansion, the particles behave much as a fluid. Fluid (gaseous or liquid) reagents can be introduced into the bed for reaction with the surface of the particles. In this invention, the fluidizing gas also can act as an inert purge gas for removing unreacted reagents and volatile or gaseous reaction products.

In addition, the reactions can be conducted in a rotating cylindrical vessel or a rotating tube. A rotating reactor comprises a hollow tube that contains the particulate. The reactor is held at an angle to the horizontal, and the particulate passes through the tube through gravitational action. The reactor angle determines the flow rate of the particulate through the reactor. The reactor is rotated in order to distribute individual particles evenly and expose all particles to the reactants. The reactor design permits the substrate particles to flow in a near plug-flow condition, and is particularly suitable for continuous operations. The reactants are introduced individually and sequentially through the reactor, preferentially countercurrent to the direction of the substrate particles.

If desired, multiple layers of ultrathin coatings can be deposited on the particle. This method has application where, due to the chemical nature of the base particle, the desired inorganic material cannot easily be deposited directly onto the particle surface. In such cases, an intermediate ultrathin layer can be applied to provide a surface to which the desired outer layer can be applied more easily. A specific instance of this is the application of a surface silica layer on boron nitride particles. As shown in Example 2 below, silica deposits somewhat unevenly onto the basal planes of boron nitride. However, by first applying a layer of alumina to the boron nitride particles, a surface is provided that can be easily overcoated with silica, as discussed more fully below.

It is also within the scope of this invention to apply a coating using atomic layer deposition methods as described before, and then conduct one or more reactions on the coating thus formed in order to modify the coating. This technique is useful for creating ultrathin coatings of various types that are not amenable to deposition using atomic layer deposition techniques. For example, various types of ultrathin oxide coatings can be formed using the atomic layer deposition techniques described above, and then can be carburized to convert the oxide to the corresponding carbide. A specific example of this is to make zirconium oxide particles that are wettable within a nickel aluminide metal matrix. This can be accomplished by depositing an ultrathin titanium oxide coating using a binary reaction scheme, and then carburizing the coating to form zirconium oxide particles having an ultrathin titanium carbide coating.

The particles of the invention are useful in a wide variety of applications, depending mainly on the composition of the particulate material. Sinterable particles can be formed into various shapes and sintered using well-known methods to form ceramic parts. Pressureless sintering processes are of particular interest. By selecting a deposited inorganic material that acts as a sintering aid, this invention provides a convenient method by which the sintering aid can be very uniformly distributed throughout the part before sintering is begun. It is believed that this can in some cases make the sintering process more efficient, lower sintering temperatures somewhat, and result in better densification of the material through the sintering process. The ability to reduce sintering temperatures is of particular interest, as it provides an opportunity to reduce energy costs. In some instances, as with sintering AlN, the ability to lower sintering temperatures can permit one to avoid the need to use sintering ovens that are specially adapted to handle high temperatures. In particular, the ability to reduce the sintering temperature of AlN to about 1600° C. or less permits AlN to be sintered in alumina refractory-lined sintering furnaces instead of graphite-lined furnaces that are now required. In these applications, particles having surface areas, before coating, of 10 $m^2/g$ or higher are of special interest.

This invention also provides a method of forming ceramic parts from two or more different sinterable inorganic materials, wherein at least one of the materials in the form of a particulate having a sintering aid or metal deposited on the particle surfaces. The fine dispersion of sintering aid or metal provides for better adhesion between the different types of particles to provide better quality sintered parts.

Similarly, ceramic materials according to the invention that have metal deposits can be shaped and sintered to form cermets. This permits fine distribution of the metal phase throughout the shaped form prior to sintering. This in turn enhances the distribution of the metal in the final part, resulting in a part having a more uniform composition. The use of metal ceramic materials with such metal deposits also permits one to reduce the amount of metal powder that is needed, or to eliminate it entirely. A system of particular interest is a tungsten carbide-based cermet. Cobalt is used as the metal phase in conventional cermet manufacturing techniques in order to improve toughness and sinterability, but the presence of cobalt tends to undesirably reduce the hardness of the final part. The use of tungsten carbide particles having a ultrathin cobalt deposits potentially provides a way to make good quality tungsten carbide cermet materials that retain much of the hardness of tungsten carbide.

A second type of particle that is useful in cermet applications is a zirconia particle coated with an ultrathin coating that enables the coated particles to be wetted by the metal component of the cermet (typically a nickel-aluminum alloy). A particularly good coating is a non-oxide coating, especially a carbide coating such as TiC. TiC coatings can be formed by depositing $TiO_2$ as described before and carburizing the $TiO_2$ coating to form TiC.

In another application, the particles of the invention are incorporated into a thermoplastic or thermoset resin as a filler or for some functional purpose. Of particular interest are epoxy resins filled with nitride particles that are coated with alumina and/or silica to enhance the compatibility of the particles with the resin matrix. These filled resins can be used to encapsulate electronic parts. Thus, in a preferred aspect, this invention includes a thermoplastic or thermoset resin containing particles of the invention.

In a related aspect, this invention is an electronic component encapsulated in a resin matrix filled with particles of AlN, BN or $Si_3N_4$ that are coated with an ultrathin, conformal alumina or silica coating. BN particles are effective ceramic fillers for microelectronics packaging due to their high thermal conductivities. However, BN is so inert that it resists wetting by the resin phase and so does not disperse well into the resin or bond to it. Silica, on the other hand, is inert to water and coupling agents have been developed so that silica particles are wet by the resin phase and bond well to it. Silica has a much lower conductivity than BN.

Accordingly, a coated particle according to the invention that is of particular interest in microelectronic packaging is a BN particle that is coated with an ultrathin layer of $Al_2O_3$, which in turn is coated with an ultrathin layer of silica. In both cases, the external silica layer permits the particle to be dispersed easily in an organic resin while passivating the underlying alumina surface. Preferably, a coupling agent adapted to couple the silica to the organic resin is incorporated into the resin or used to treat the particle surface before it is dispersed into the resin. In each case, a silica layer of about 1 to about 200 nm, preferably from about 1 to about 100 nm, especially from about 5 to about 20 nm is suitable to provide the desired surface properties without having a significant effect on the bulk properties of the underlying particle.

When silica is deposited onto BN particles, it tends to deposit well onto the edges of the basal planes of the particles but deposits randomly onto the basal planes themselves. By contrast, alumina tends to deposit much more uniformly onto both the basal planes and edges. Thus, the alumina layer provides a particle surface onto which the silica layer can be deposited as a continuous layer. The alumina layer can be from about 0.25 to about 200 nm thick, but can be somewhat thinner than the silica layer, as the function of the alumina layer is to provide adhesion between the BN particle and the overlying silica layer. Thus, the alumina layer is preferably from about 0.5 to about 20 nm thick, and more preferably up to about 15 nm thick.

Metal particles coated according to the invention with a non-conductive coating can also be used as thermal management materials. They are especially useful in applications where the high heat conductivity associated with most metals is desired, but the filler must be non-conductive. Examples of such applications include the microelectronics packaging applications described above. Metal particles used in this application preferably have conformal coatings over the entire surface of the particles. The coatings preferably have surface functional groups such as hydroxyl, N—H or S—H. When the particles are used as fillers for organic polymers, these functional groups provide sites to which the particles can bond (either directly or through the use of coupling agents) to an organic polymer. This improves the performance of the filled polymer and facilitates the blending of the particles into the polymer.

Another application is in thermite explosives and propellants. Thermite explosives consist of a mixture of a finely divided metal fuel and an oxidizer. The oxidizer is typically an oxide of a second metal. The relationship of the metal fuel and second metal is that the heat of formation of the oxide of the second metal is much lower than that of the oxide of the metal fuel. Alumina has a particularly high heat of formation from the corresponding metal, aluminum, and is commonly used as the metal fuel. Examples of oxidizers for use with alumina (and other metal fuels) are $Fe_2O_3$, $MoO_3$, $Co_3O_4$, NiO, $MnO_2$, $WO_3$, CuO and $SnO_2$.

Although thermite reactions can yield a much higher reaction enthalpy than do conventional explosives (such as TNT), the explosive reaction velocity for the thermite reactions is typically much lower. This phenomenon is believed to be due to the relative spacing of the fuel and oxidizer in the two types of systems. In conventional explosives, the oxidizer (oxygen) is contained in the same molecule as the fuel. In thermite systems, the fuel and oxidizer are on separate particles. This separation is believed to account for the lower explosive reaction velocities generated by thermite systems.

Accordingly a particle according to the invention that is of interest in thermite explosive applications is metal fuel particle having ultrathin deposits of an oxidizer on the particle surface. Of particular interest are aluminum particles having ultrathin deposits of NiO, $WO_3$, $Co_3O_4$, MnO or SnO, or a combination of two or more of these. Specific ALD methods of depositing NiO, $WO_3$, $Co_3O_4$, MnO and SnO coatings are described in M. Utriainen et al., Mater. Sci. Eng. B. 54, 98 (1998), Tagtstrom et al., J. Electrochem. Soc. 146, 3139 (1999), Seim et al., Appl. Surf. Sci. 112, 243 (1997), Nilsen et al., J. Mater. Chem. 9, 1781 (1999) and Viirola et al., Thin Solid Films 249, 144 (1994), all incorporated herein by reference.

For thermite applications, the substrate metal particle preferably has a particle size of less than 10 microns, preferably less than 1 micron, more preferably less than 100 nm, especially less than 50 nm. The ultrathin deposits are advantageously from about 0.5 to about 500 nm, more preferably from about 1 to about 100 nm in thickness, especially about 1 to about 20 nm in thickness. It is not necessary in this application that the inorganic coating be continuous or conformal, although that is preferred.

The thermite particles of the invention may be used in explosive devices or to generate energy. The thermite particles can be used to form rods for thermal burning or cutting torches. The use of thermite rods in such applications is described in U.S. Pat No. 4,541,616, incorporated herein by reference. The particles may be used for waste treatments, using the general methods of treating waste described in U.S. Pat. No. 6,225,519, incorporated herein by reference. They can be fabricated into casings for circuit breakers, such as are described in U.S. Pat. No. 6,385,026, incorporated herein by reference, and used in demolition applications as described, for example, in U.S. Pat. No. 5,532,449.

In yet another application for certain particles according to the invention, the deposited inorganic material is a metal having catalytic activity. In these applications, a chemical reaction is conducted in the presence of particles coated with a metal that is a catalyst for the reaction.

Still another specific application is to coat submicron iron particles with an infrared-transparent ultrathin coating such as silica. The resulting particles are rust-resistant resistant yet radar-absorbent. The particles can be combined with a binder to form a coating material for aircraft and other vehicles, which reduces the amount of radar reflected by the vehicle.

Another example is in the use of coated powder metal particles for electromagnetic applications. In the past, polymer-coated powdered metal particles have been used in electromagnetic ignition coils. The polymer is a crosslinking thermoset polymer placed on the individual particles. The polymer coating protects the metal particle from detrimental diffusion of oxygen, moisture, and corrosive gases and vapors. Multiple layers of polymer coating also provide a barrier form of protection for each particle against elemental magnetic degradation, which may occur, thereby lowering the irreversible losses. It is preferable to ensure that each iron particle is individually coated with a uniform thickness of polymer and that agglomerates of particles are not coated. Hence, the coatings should protect each particle from undesirably affecting each other. A typical particle size of the iron powder is 100 microns.

Still another application is in Magnetic Targeted Carrier (MTC) drug delivery processes. MTC processes involve the use of magnetic or paramagnet particles as delivery vehicles for the site specific targeting, retention and release of pharmaceuticals. Such processes are described, for example, in U.S. Pat Nos. 5,549,915, 5,705,195 and 6,200,547, all to Volkonsky et al. Two conventional types of particles are magnetite ($Fe_3O_4$) particles encased in albumin, and mixtures of metallic iron and activated carbon. The pharmaceutical is absorbed into the albumin or carbon, which will in vivo release the pharmaceutical over time. The mixture is injected arterially. A magnetic field is applied to the targeted area for the targeted delivery of pharmaceutical agents to specific areas of the body. The magnet creates a localized magnetic field within the body, in the area where the pharmaceutical is to be delivered. The attractive force created by the magnetic field draws the MTC and pharmaceutical through the arteriole wall into the targeted area. The pharmaceutical remains localized and is retained at the desired site even after the magnetic field has been removed.

A wide variety of pharmaceutical agents can be used, including small molecules, radionuclides, biologics, imaging agents and genetic vectors. Specific examples of pharmaceuticals include doxorubicin, paclitaxel, $^{99}Tc$, $^{186}Re$, $^{188}Re$, methotrexate, thalidomide, FUDR, Mitomycin C, bleomycin and vinblastine.

Coated particles of the invention, in which the particle substrate is a magnetic or paramagnetic material, can be used several ways in MTC processes. Suitable magnetic or paramagnetic materials include Fe, Co, Ni, Zn, Mn, Mg, Ca, Ba, Sr, Cd, Hg, Al, B, Sc, Ga, V, Ti, In, $Fe_3O_4$, $Fe_2O_3$, $TiO_2$, ZnO, FeO or a mixture or alloy of any two or more of the foregoing. In one embodiment, magnetic or paramagnetic substrate particles that are coated with a passivating coating that is biologically inert, such as alumina. The coating isolates the underlying substrate particle from bodily fluids that can cause corrosion, degradation, or undesired absorption of the particle into tissues. It can also provide a means of control over the magnetic or paramagnetic properties of the particle, through changing the thickness of the coating. The coated particles can then be mixed with activated carbon and the pharmaceutical, as described in the Volkonsky patents referred to above. Alternatively, the coated particles may be encased or encapsulated in an organic polymer which (1) is biologically benign and (2) which will absorb the pharmaceutical and release it in vivo. Examples of such polymers are albumin, fluoropolymers, a cellulose polymer (such as sodium carboxymethyl cellulose), a chlorinated olefin polymer, a polyamide, a poly(acrylic acid)-poly(alkylene ether) graft copolymer, polymers of glycolide, lactide and/or caprolactone (such as are commercially available from Birmingham Polymers, Inc.) or mixture of gelatin and polymeric acid such as gum arabic, mannitol, and polyvinyl pyrrolidone.

A particularly useful coated particle according to the invention for this application is iron, having an alumina coating. The coating is advantageously up to 100 nm thick, especially up to 20 nm thick, covers substantially the entire surface of the particle, and is even more preferably conformal. The size of the substrate particles may be in the range of 1 to 1000 nanometers. The paramagnetic effect can be detected in particles or crystals as small as 1 nanometer. Particle typically larger than 10 nanometers are rapidly taken up by the mononuclear phagocyte system of the liver, spleen, lymph nodes, and bone marrow following intravenous administration to permit imaging of these organs. Particles larger than approximately 1000 nanometers will be trapped in the capillaries of the lungs.

Mixtures of coated metal particles and carbon for this application can be prepared by mechanically milling the particles together. The resulting microparticles can absorb or carry a specified drug on the carbon component. The resulting mixture is then combined with the desired drug. This is conveniently done locally at the place of administration of the pharmaceutical, but can be done in advance. Prior to MTC-drug administration, the magnetic applicator is positioned over the patient's treatment site. The MTC carrying the absorbed drug is then injected via an intra-arterial catheter positioned proximal to the desired site. Injecting the MTCs into an artery ensures that the magnetic force acting on the particles has an opportunity to draw the MTCs out of the vasculature during their first pass through the magnetic field and to be localized at the desired site by extravasation. The magnet remains in place during the administration period and is removed some time, such as 15 minutes, after dose administration.

Imaging (such as MRI) can be performed once the pharmaceutical (such as an imaging agent) is concentrated into the desired site. For MRI applications or other imaging or diagnostic techniques that employ magnetic or paramagnetic imaging materials, the coated particle of the invention may be used directly and alone as the magnetic or paramagnetic imaging material.

A still further application is the formation of reflective particles, for example, to provide reflective coatings on glass and other substrates. An example of a coated particle according to the invention is a silica or fumed silica substrate particle that is coated with tungsten, aluminum, silver or other metal. These particles can be coated onto or incorporated into glass or other substrate to provide a coating that reflects, for example, UV rays or other electromagnetic radiation. The particles are preferably used in a concentration that (1) most or all visible light is transmitted through the substrate and (2) UV or other reflected radiation is reflected randomly.

The following examples are provided to illustrate the invention, but are not intended to limit its scope. All parts and percentages are by weight unless otherwise indicated.

EXAMPLE 1

Atomic Layer Deposition of Alumina on BN Particles

Alumina ($Al_2O_3$) is deposited on BN particles in a vacuum apparatus designed for in situ transmission FTIR vibrational spectroscopy studies. This apparatus is described in more detail by Dillon et al. (1992) *J. Electrochem. Soc.* 139:537–543, as well as in the copending application Ser. No. 08/442,907, filed May 17, 1995, both incorporated by reference. The BN nitride particles are HCV Grade BN particles from Advanced Ceramics Corporation. They are approximately 10 micron agglomerates composed primarily of approximately 0.1–0.5 micron turbostratic crystals with a total surface area of about 40 $m^2/g$.

The BN particles are supported on a tungsten photoetched grid from Buckbee Mears, St. Paul, Minn., having dimensions of 2×3 cm, a thickness of 2 mils and a grid spacing of 100 lines per inch. The BN particles are pressed into the tungsten grid using polished stainless steel dies and a manual press. Tantalum foil is spot-welded to each side of the grid to provide good electrical contacts and facilitate resistive heating. A Chromel-Alumel thermocouple is glued to the center edge of the grid using Aremco Type 571 ceramic adhesive. The grid is then suspended between two copper clamps in an x-y-z manipulator, between 13 mm cesium iodide windows. The manipulator is equipped with liquid $N_2$ cryostat and current and thermocouple feedthroughs for sample heating and temperature regulation. A Nicolet 740 FTIR spectrometer and corresponding MCT detector are situated by opposing cesium iodide windows.

A gate valve separates the apparatus into an upper chamber and a lower chamber. Dual turbo pumps are provided to maintain a high vacuum in lower chamber. A second gate valve connects the turbo pumps with the lower chamber. The lower chamber is equipped with an ion gauge and a Dycor quadruple mass spectrometer.

After loading the BN particles into the upper chamber, the samples are annealed at 700° K to remove an observed $H_2O$ adlayer from the surface of the particles. To observe the surface functionality of the particles, they are exposed to $D_2O$ at 700° K in order to exchange hydrogen atoms for deuterium atoms. FTIR then confirms the presence of surface B—O—D and B—N—D groups on the surface of the particles.

The particles are then sequentially exposed to 50 cycles of $Al(CH_3)_3$ and water at 450° K to deposit 90 angstrom coatings of alumina onto the particle surfaces. Reactant exposures of $1.8 \times 10^8$ Langmuirs (L,=$10^{-6}$ Torr·sec) are used in each reaction in order to ensure that the reaction goes to completion in each step. Low pressure exposures consist of reactant pressures in the range of $1 \times 10^{-4}$ to $1 \times 10^{-3}$ Torr, with the gate valve between the upper and lower chambers open. For high pressure exposures, the upper chamber is evacuated with a liquid $N_2$ trap backed by a mechanical pump to provide exposures at 0.01 to 10 Torr. The upper chamber is then opened to the lower chamber and the turbomolecular pump to provide pressures of less than $2 \times 10^{-6}$ Torr between exposures. Approximately 1.8 angstroms of $A_2O_3$ growth are seen per reaction cycle.

B—O—H AND B—N—H stretching vibrations decrease progressively as the reaction sequence is repeated, essentially disappearing after six cycles. This indicates that only six reaction cycles are needed to initiate $Al_2O_3$ growth on the entire surface of the particles. X-ray photoelectron spectroscopy (AXIS Hsi Kratos Analytical XPS spectrometer, base pressure $1 \times 10^9$ Torr,$\Delta E$=constant mode at a pass energy of 80 eV using an Al anode (1486.7 eV energy at 15 kV, 15 mA) in a slot mode) of the final product reveals negligible photoelectron intensity associated with boron nitride, again confirming essentially complete contain of the particle surfaces. Transmission electron microscopy images are obtained with a HRTEM JEOL 2010 high resolution transmission electron microscope using electron dispersive spectroscopy and GATAN digital microgram with a slow scan CCD camera. TEM shows that the product has extremely uniform and conformal $Al_2O_3$ coatings having a thickness of about 90 angstroms. The coating is deposited well on the basal planes and edges of the particles.

EXAMPLE 2

In this example, a silica ($SiO_2$) coating is applied to BN particles using the apparatus described in example 1. In this case, the reagents are $SiCl_4$ and water, and 32 reaction cycles are performed. Exposure is performed at 700° K, and exposures of about $1\times10^{10}$L are used. Low pressure exposures are at pressures of $1\times10^{-4}$ to $1\times10^{-3}$ Torr and high pressure exposures range from 0.01 to 10 Torr. Pressures between exposures are less than $2\times10^{-6}$ Torr.

TEM images of the product show that the basal planes of the BN particles are randomly covered with $SiO_2$, whereas the edge planes are fairly uniformly covered.

EXAMPLE 3

A 25 angstrom thick alumina film was placed upon 100 micron average diameter nickel particles in a fluidized bed. Prior to running deposition experiments, the minimum fluidization velocity was determined for these nickel particles using a glass reactor. The glass reactor has an inner diameter of 4 cm. Minimum fluidization velocity at 2 Torr was determined to be 40 cm/s, or 80 sccm @ STP. Once fluidization characteristics were discovered for the nickel particles, deposition experiments were run. The reactor used for these experiments is constructed of stainless steel, with two reactant gas inlets just above the distributor plate. The distributor was constructed of 0.25 micron average pore size porous metal. This reactor is also tubular, having an inside diameter of 4 cm, and a height of 1 m. The top of the reactor is connected to a large vacuum pump (Alcatel model 2063) to provide system vacuum; the bottom of the reactor is connected to a mass flow controller, which controls the fluidizing gas flow. Fluidizing gas was dry nitrogen taken from a liquid nitrogen source dewar. Reactant gases (trimethyl aluminum and water) were admitted into the system via two separate injection loops. The loops were carefully constructed to ensure that both loops had the same conductance, with a needle valve controlling each loops' final conductance. The needle valves were both set at approximately ¼ turn open. Reactant vapor pressure was used as the driving force for flow. A purge setup was achieved by connecting the system to both a mass flow controller that provided a nitrogen purge source and a separate vacuum pump, one for each loop (Alcatel model 2008A). Valves that controlled the system flows were all pneumatically operated and remotely controlled via a LABVIEW program running on a personal computer.

One hundred grams of 100 micron nickel particles were placed in the stainless steel tubular fluidized bed reactor. This made the resting bed height approximately 1.5 cm. System pressure was brought down to operating pressure, then fluidizing gas flow was started at 100 sccm. Purge flows were then started at 50 sccm. The reactor was then heated to 700 K to anneal the nickel particles, then cooled back to 450 K for the reactions. First, TMA was admitted into the reactor for 5 seconds, then purge flow was conducted for 120 seconds. Next, $H_2O$ was admitted into the reactor for 5 seconds, then purge flow was conducted for 120 seconds. This A–B sequence (where A=TMA and B=$H_2O$) was repeated 25 times. An average of 1 angstrom per cycle was achieved.

XPS analysis of the surface of these particles indicates that the surface is coated with alumina, as evidenced by the appearance of Al 2 p peaks in the spectrum at binding energy values of approximately 72–77 eV.

EXAMPLE 4

A 50 angstrom thick alumina coating is placed upon 100 micron average diameter nickel particles. Fifty (50) angstroms of alumina are placed upon the nickel particles in exactly the same manner as in Example 3, except the number of A–B cycles is increased to 50. Analysis shows the same results as in the 25 angstrom sample, only the thickness is increased to 50 angstroms.

EXAMPLE 5

A 75 angstrom thick alumina coating is placed upon 100 micron average diameter Nickel particles. Seventy-five (75) angstroms of alumina are placed upon the nickel particles in exactly the same manner as Example 1, except the number of A–B cycles is increased to 75. Analysis shows the same results as in the 25 angstrom sample, only the thickness is increased to 75 angstroms.

EXAMPLE 6

A 100 angstrom thick alumina coating is placed upon 100 micron average diameter nickel particles. One hundred (100) angstroms of alumina are placed upon the nickel particles in exactly the same manner as Example 1, except the number of A–B cycles is increased to 100. Analysis shows the same results as in the 25 angstrom sample, only the thickness is increased to 100 angstroms.

What is claimed is:

1. A material in the form of non-agglomerated particles having an average diameter of less than about 500 microns, comprising substrate particles having an ultrathin film of an inorganic material deposited on the surface thereof.

2. The material of claim 1 wherein the inorganic material has a thickness of from about 0.5 to about 35 nanometers.

3. The material of claim 1 wherein the inorganic material is a metal or an inorganic oxide, nitride, sulfide or phosphide.

4. The material of claim 3 wherein the substrate particles are of a Group 3, 13 or 14 nitride or a Group 4, 6, 13 or 14 carbide, and the ultrathin inorganic material is an inorganic oxide or a metal.

5. The material of claim 4 wherein the substrate particles are of a sinterable material and the inorganic material is a metal.

6. The material of claim 5 wherein the ultrathin inorganic material is a sintering aid.

7. The material of claim 2 wherein the substrate particles are metal particles and the ultrathin inorganic material is an inorganic oxide, nitride, sulfide or phosphide.

8. The material of claim 7 wherein the metal is iron and the ultrathin inorganic material is transparent to IR radiation.

9. A method for depositing an ultrathin inorganic material on substrate particles comprising conducting a sequence of two or more self-limiting reactions at the surface of said substrate particles to form coated particles having an ultrathin layer of an inorganic material bonded to the surface of said substrate particles.

10. The method of claim 9, wherein the sequence is a binary sequence of reactions represented as

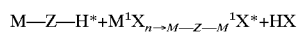

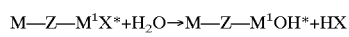

wherein Z represents oxygen or nitrogen, M¹ is an atom of a metal or semimetal and X is a displaceable nucleophilic group.

11. The method of claim 10 wherein M¹ is silicon, titanium or aluminum.

12. The method of claim 9 wherein the sequence is a binary sequence of reactions represented as

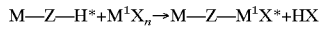

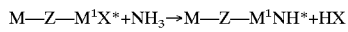

wherein Z represents oxygen or nitrogen, M¹ is an atom of a metal or semimetal and X is a displaceable nucleophilic group.

13. The method of claim 9 wherein the sequence is a binary sequence of reactions represented as

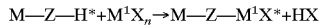

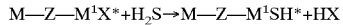

wherein Z represents oxygen or nitrogen, M¹ is an atom of a metal or semimetal and X is a displaceable nucleophilic group.

14. The method of claim 9 wherein the substrate particles are an inorganic nitride or carbide.

15. The method of claim 9 wherein the sequence of reactions is continued until a coating of desired thickness is obtained.

16. The method of claim 15 wherein the ultrathin inorganic material has a thickness of about 0.5 to about 35 nanometers.

17. The method of claim 9 wherein a precursor reaction is conducted to impart functional groups on the surface of the substrate particle before conducting said sequence of reactions.

18. The method of claim 9 wherein said sequence of reactions is a sequence of catalyzed reactions.

19. The method of claim 9 wherein said sequence of reactions is a binary sequence of reactions comprising contacting said substrate particle alternately with a metal halide and a metal halide reducing agent.

20. The method of claim 19 wherein said metal halide is a fluoride or chloride of tungsten, rhenium, molybdenum, antimony, selenium, thallium, chromium, platinum, ruthenium, iridium, or germanium.

21. A resin matrix filled with particles of claim 1.

22. An electronic component encapsulated with a resin matrix of claim 21.

23. A method of making a cermet part, comprising forming a shaped mass of particles of claim 5, and then exposing said shaped mass to conditions sufficient to sinter the particles to form a part.

24. The method of claim 23, wherein said ultrathin inorganic material is cobalt, aluminum, or nickel aluminide.

25. A method of making a ceramic material, comprising forming a shaped mass of particles of claim 6 and then exposing said shaped mass to conditions sufficient to sinter the particles to form a shaped part.

26. A method of catalyzing a chemical reaction, comprising conducting said chemical reaction in the presence of particles of claim 1, wherein the inorganic material is a metal that is a catalyst for said chemical reaction.

27. The resin matrix of claim 21, wherein the particles are BN particles coated with an ultrathin layer of alumina, which is in turn coated with an ultrathin layer of silica.

28. The resin matrix of claim 21, wherein the substrate particle is a metal and the inorganic material is a conformal coating of a non-conductive inorganic material.

29. The resin matrix of claim 21, wherein the substrate particle is a metal and the inorganic material is a conformal coating of an inorganic material having surface O—H, N—H or S—H groups.

30. The material of claim 1 wherein the inorganic material forms a conformal coating.

31. The material of claim 1 wherein the substrate particle is a metal fuel and the inorganic material is an oxidizer.

32. The material of claim 31 wherein the metal fuel is aluminum and the oxidizer is NiO, WO₃, Co₃O₄, MnO or SnO₂.

33. An explosive device comprising the material of claim 32.

34. A thermite rod comprising the material of claim 32.

35. The material of claim 1 wherein the substrate material is iron and the inorganic material is silica.

36. The material of claim 1 wherein the substrate particle is magnetic or paramagnetic.

37. A magnetically responsive composition comprising the material of claim 36, particles of activated carbon, the material and the activated carbon having a particle size of 1–1000 nm, and a therapeutic or diagnostic substance.

38. A magnetically responsive composition comprising the material of claim 36 having a particle size of 1–1000 nm, a biologically inert polymer and a therapeutic or diagnostic substance, wherein the therapeutic or diagnostic substance is sorbed onto the biologically inert polymer, the biologically inert polymer is present on a surface of the material, and the biologically inert polymer is biologically benign.

39. A method for delivering a pharmaceutical to a specific site in a patient, comprising:
   (a) delivering the material of claim 37 into a blood vessel of the patient; and
   (b) establishing a magnetic field exterior to the patient and adjacent to the specific site of sufficient field strength to guide a portion of said material through the blood vessel to a point at or near the site so that a therapeutic amount of the therapeutic or diagnostic substance concentrates at the specific site.

40. A method for delivering a pharmaceutical to a specific site in a patient, comprising:
   (a) delivering the material of claim 38 into a blood vessel of the patient; and
   (b) establishing a magnetic field exterior to the patient and adjacent to the specific site of sufficient field strength to guide a portion of said material through the blood vessel to a point at or near the site so that a therapeutic amount of the therapeutic or diagnostic substance concentrates at the specific site.

41. The method of claim 39 wherein the specific site is a disease site.

42. The method of claim 40 wherein the specific site is a disease site.

43. The material of claim 3 wherein the inorganic material is alumina and the substrate particles are Fe, Co, Ni, Zn, Mn, Mg, Ca, Ba, Sr, Cd, Hg, Al, B, Sc, Ga, V, Ti, or In.

44. The material of claim 3 wherein the inorganic material is alumina and wherein the substrate particles are Nd—Fe—B.

45. The material of claim 3 wherein the inorganic material is alumina and wherein the substrate particles are Fe₃O₄, Fe₂O₃, TiO₂, ZnO, or FeO.

46. The material of claim 3 wherein the inorganic material is alumina and the substrate material is nickel (Ni) and has a particle size of between 50 and 150 microns.

47. A non-agglomerated product made by the process of claim 9.

48. A non-agglomerated product made by the process of claim 13.

49. A non-agglomerated product made by the process of claim 16.

50. A non-agglomerated product made by the process of claim 18.

51. The process of claim 9 wherein the coated particles have an average particle size not more than 5% more than the substrate particles, apart froms particle size increases attributable to the thickness of the coating.

52. The process of claim 9 wherein no more than 2 weight percent of the particles become agglomerated during the deposition of the ultrathin inorganic material.

53. The material of claim 1 wherein the non-agglomerated particles have an average particle size not more than 5% greater than the substrate particles, apart from particle size increases attributable to the thickness of the coating.

54. The material of claim 1 wherein no more than 2 weight percent of the particles become agglomerated during the deposition of the ultrathin inorganic material.

55. A material in the form of particles having an average diameter of less than about 500 microns, comprising substrate particles having an ultrathin, conformal continuous or semicontinuous film of an inorganic material deposited on the surface thereof.

56. The material of claim 55 wherein the film has thickest regions that are no greater than 3 times the thickness of thinnest regions of the film, as determined by a method that has a resolution of 10 nm or below.

57. The material of claim 56 wherein the inorganic material has a thickness of from about 0.5 to about 35 nanometers.

58. The material of claim 57 wherein the inorganic material is a metal or an inorganic oxide, nitride, sulfide or phosphide.

59. The material of claim 58 wherein the substrate particles are of a Group 3, 13 or 14 nitride or a Group 4, 6, 13 or 14 carbide, and the ultrathin inorganic material is an inorganic oxide or a metal.

60. The material of claim 59 wherein the substrate particles are of a sinterable material and the inorganic material is a metal.

61. The material of claim 60 wherein the ultrathin inorganic material is a sintering aid.

62. The material of claim 57 wherein the substrate particles are metal particles and the ultrathin inorganic material is an inorganic oxide, nitride, sulfide or phosphide.

63. The material of claim 62 wherein the metal is iron and the ultrathin inorganic material is transparent to IR radiation.

64. The material of claim 55 wherein the substrate particle is a metal fuel and the inorganic material is an oxidizer.

65. The material of claim 64 wherein the metal fuel is aluminum and the oxidizer is NiO, $WO_3$, $Co_3O_4$, MnO or $SnO_2$.

66. The material of claim 55 wherein the substrate material is iron and the inorganic material is silica.

67. The material of claim 55 wherein the substrate particle is magnetic or paramagnetic.

68. The material of claim 55 wherein the film is substantially free of pinholes and defects.

69. A resin matrix filled with particles of claim 55.

70. The resin matrix of claim 69, wherein the particles are BN particles coated with an ultrathin layer of alumina, which is in turn coated with an ultrathin layer of silica.

71. The resin matrix of claim 69, wherein the substrate particle is a metal and the inorganic material is a conformal coating of a non-conductive inorganic material.

72. A method of making a cermet part, comprising forming a shaped mass of particles of claim 60, and then exposing said shaped mass to conditions sufficient to sinter the particles to form a part.

73. The method of claim 72, wherein said ultrathin inorganic material is cobalt, aluminum, or nickel aluminide.

74. A method of making a ceramic material, comprising forming a shaped mass of particles of claim 61 and then exposing said shaped mass to conditions sufficient to sinter the particles to form a shaped part.

75. A method of catalyzing a chemical reaction, comprising conducting said chemical reaction in the presence of particles of claim 55, wherein the inorganic material is a metal that is a catalyst for said chemical reaction.

76. An explosive device comprising the material of claim 64.

77. A thermite rod comprising the material of claim 64.

78. A magnetically responsive composition comprising the material of claim 67, having particles of activated carbon, the material and the activated carbon each having a particle size of 1–1000 nm, and a therapeutic or diagnostic substance.

79. A magnetically responsive composition comprising the material of claim 67 having a particle size of 1–1000 nm, a biologically inert polymer and a therapeutic or diagnostic substance, wherein the therapeutic or diagnostic substance is sorbed onto the biologically inert polymer, the biologically inert polymer is present on a surface of the material and the biologically inert polymer is in biologically benign.

80. A method for delivering a pharmaceutical to a specific site in a patient, comprising:
   (a) delivering the material of claim 78 into a blood vessel of the patient; and
   (b) establishing a magnetic field exterior to the patient and adjacent to the specific site of sufficient field strength to guide a portion of said material through the blood vessel to a point at or near the site so that a therapeutic amount of the therapeutic or diagnostic substance concentrates at the specific site.

81. A method for delivering a pharmaceutical to a specific site in a patient, comprising:
   (a) delivering the material of claim 79, into a blood vessel of the patient; and
   (b) establishing a magnetic field exterior to the patient and adjacent to the specific site of sufficient field strength to guide a portion of said material through the blood vessel to a point at or near the site so that a therapeutic amount of the therapeutic or diagnostic substance concentrates at the specific site.

82. The method of claim 80 wherein the specific site is a disease site.

83. The method of claim 81 wherein the specific site is a disease site.

* * * * *